(12) United States Patent
Yamaguchi et al.

(10) Patent No.: US 7,414,417 B2
(45) Date of Patent: Aug. 19, 2008

(54) CONTACT SHEET FOR TESTING ELECTRONIC PARTS, APPARATUS FOR TESTING ELECTRONIC PARTS, METHOD FOR TESTING ELECTRONIC PARTS, METHOD FOR MANUFACTURING ELECTRONIC PARTS AND ELECTRONIC PARTS

(75) Inventors: Naoko Yamaguchi, Yokohama (JP); Hideo Aoki, Yokohama (JP); Chiaki Takubo, Tokyo (JP); Toshiro Hiraoka, Yokohama (JP); Yasuyuki Hotta, Tokyo (JP); Shigeru Matake, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 24 days.

(21) Appl. No.: 10/885,777

(22) Filed: Jul. 8, 2004

(65) Prior Publication Data

US 2005/0024067 A1 Feb. 3, 2005

(30) Foreign Application Priority Data

Jul. 10, 2003 (JP) ............................ P2003-194833

(51) Int. Cl.
*G01R 31/02* (2006.01)
*H01L 21/66* (2006.01)
*B23K 31/02* (2006.01)

(52) U.S. Cl. .................... 324/754; 228/180.22; 438/17
(58) Field of Classification Search ................. 324/754; 438/17; 228/180.22
See application file for complete search history.

(56) References Cited

U.S. PATENT DOCUMENTS

| 5,262,718 | A | * | 11/1993 | Svendsen et al. ............. 324/754 |
| 5,830,565 | A | | 11/1998 | Budnaitis |
| 5,946,791 | A | * | 9/1999 | Baldwin ....................... 29/593 |
| 6,046,060 | A | | 4/2000 | Budnaitis |
| 6,069,482 | A | * | 5/2000 | Hilton ......................... 324/755 |
| 6,208,155 | B1 | * | 3/2001 | Barabi et al. ................. 324/754 |
| 6,332,270 | B2 | * | 12/2001 | Beaman et al. ................ 29/844 |
| 6,384,618 | B1 | * | 5/2002 | Pursel et al. ................. 324/765 |
| 6,404,214 | B1 | * | 6/2002 | Muramatsu et al. ......... 324/754 |
| 6,420,887 | B1 | * | 7/2002 | Kister et al. ................ 324/754 |
| 6,465,742 | B1 | | 10/2002 | Hiraoka et al. |
| 6,518,784 | B2 | | 2/2003 | Fukasawa et al. |
| 6,535,002 | B2 | * | 3/2003 | Haseyama et al. .......... 324/754 |
| 6,559,666 | B2 | * | 5/2003 | Bernier et al. .............. 324/755 |
| 2001/0040464 | A1 | * | 11/2001 | Tanioka et al. .............. 324/765 |
| 2002/0004180 | A1 | | 1/2002 | Hotta et al. |
| 2003/0107465 | A1 | | 6/2003 | Hiraoka et al. |
| 2004/0205402 | A1 | * | 10/2004 | Yamaguchi et al. ........... 714/30 |

FOREIGN PATENT DOCUMENTS

| JP | 55-161306 | 12/1980 |
| JP | 11-163203 | 6/1999 |
| JP | 2001-83347 | 3/2001 |
| JP | 2001-345537 | 12/2001 |

* cited by examiner

*Primary Examiner*—Ernest F Karlsen
(74) *Attorney, Agent, or Firm*—Finnegan, Henderson, Farabow, Garrett & Dunner, L.L.P.

(57) ABSTRACT

According to one aspect of the invention, a contact sheet for testing electronic parts, comprising an insulating porous layer; and a connection electrode which is disposed on the insulating porous layer and electrically connect the electrode or terminal of the electronic parts and the terminal of a test apparatus; wherein the connection electrode is embedded below at least one main surface of the insulating porous layer.

15 Claims, 12 Drawing Sheets

TOP SURFACE

BOTTOM SURFACE 1
(WITHOUT WIRING)

BOTTOM SURFACE 2
(WITH WIRING)

CONTACT SHEET FOR TESTING ELECTRONIC PARTS, APPARATUS FOR TESTING ELECTRONIC PARTS, METHOD FOR TESTING ELECTRONIC PARTS, METHOD FOR MANUFACTURING ELECTRONIC PARTS AND ELECTRONIC PARTS

CROSS-REFERENCE TO THE INVENTION

This application is based upon and claims the benefit of priority from the prior Japanese Patent Application No. 2003-194833, filed on Jul. 10, 2003; the entire contents of which are incorporated herein by reference.

BACKGROUND OF THE INVENTION

1. Field of the Invention

The present invention relates to a contact sheet for testing electronic parts such as semiconductor wafers, semiconductor chips, BGA (Ball Grid Allay) packages and passive elements, a test apparatus having a contact sheet, and a test method using this test apparatus, electronic parts manufacturing method, and electronic parts.

2. Description of the Related Art

With the miniaturization and simplification of the semiconductor package, KGD (Known Good Die) technology to detect good or bad of each chip is needed when many chips are mounted on a single package such as MCM (Multi Chip Module) or for the bear die supply of COB (Chip On Board).

Conventionally, after a semiconductor chip is mounted on a package substrate, a test substrate such as a hard testing multilayer substrate is pressed against the OLB terminal or the electrodes of the semiconductor chip or wafer to electrically contact so to conduct a test. At this time, the electrodes of the electronic parts such as the semiconductor chip or the semiconductor wafer are contacted to the substrate electrodes of the test substrate. The test apparatus has the test substrate and the test circuit and also has wiring for electrical connection between the test substrate and the test circuit. Where a BGA package is subject to a burn-in test or the like, a BGA ball package is placed in a dedicated socket which is electrically connected to the test circuit and contacted under pressure for testing. In using the wafer or the like, a probe is pressed against the electrodes of the wafer.

The test includes, for example, a high-temperature bias test. This test exposes a device to a high-temperature atmosphere while applying a voltage. This test is an acceleration test simulating actual busy conditions and can provide a test result in a short time by physically and temporally accelerating the cause of deterioration. This test is used as part of a life test involved in screening (or the burn-in test) for removal of an initial failure and reliability tests.

As to the burn-in test for a wafer level, there is a known test apparatus (see Japanese Patent Laid-Open Application No. Hei 10-284556) that a wafer is held on a base with the element surface having the electrodes formed upward, and that comprises a multilayer sheet which has protruded electrodes in positions to face the electrodes of the wafer, flexible members having conductivity in positions to face the electrodes, a burn-in base material unit having high flatness and wiring to the test circuit, and a mechanism for applying a pressure.

Conventional technology having a porous resin disposed between an insulating substrate and a semiconductor chip of a semiconductor package and maintaining their joined state in a good condition is also known (see Japanese Patent Laid-Open Application No. Hei 11-163203). Technology of forming via or wiring within the porous body of an insulating material such as a liquid crystalline polymer including polytetrafluoroethylene, polyimide and aramid is known (see Japanese Patent Laid-Open Applications No. 2001-345537 and No. 2001-83347).

When the electrodes (e.g., solder bumps) of a semiconductor chip or the like are soldered to a hard test substrate, the electrodes of the semiconductor chip or the test substrate are broken or the solder bumps are broken at any part when the semiconductor chip is removed from the test substrate, so that it is hard to control such damage. Therefore, the burn-in test or the like is conducted with the electrodes or terminals of a package or a chip pressed against the test substrate. In such a case, the test apparatus requires a mechanism to pressurize and hold electronic parts such as a semiconductor chip other than an aligning mechanism.

BRIEF SUMMARY OF THE INVENTION

According to an aspect of the present invention, there is provided a contact sheet for testing electronic parts, comprising an insulating porous layer; and connection electrode which is disposed on the insulating porous layer and electrically connect the electrode or terminal of the electronic parts and the terminal of a test apparatus; wherein the connection electrode is embedded below at least one main surface of the insulating porous layer.

According to another aspect of the invention, there is also provided a contact sheet for testing electronic parts, comprising an insulating via layer in which a connection electrode for electrically connecting the electrode or terminal of the electronic parts and the terminal of a test apparatus is embedded; and an insulating porous layer which is formed on two opposed main surfaces of the insulating via layer.

According to another aspect of the invention, there is provided a contact sheet for testing electronic parts, comprising an insulating porous layer; and a solder guiding material layer which is comprised of Sn or an alloy containing the Sn, at least partly formed in the insulating porous layer and guides the electrode or terminal of the electronic parts.

According to another aspect of the invention, there is provided an apparatus for testing electronic parts, comprising a test circuit; and the contact sheet for testing electronic parts as discussed herein, which is electrically connected to the test circuit; wherein the connection electrode is melt-bonded with the electrode or terminal of the electronic parts which are disposed at the time of testing, and the electrode or terminal of the electronic parts is a solder bump or a solder ball.

According to another aspect of the invention, there is provided an apparatus for testing electronic parts, comprising a test circuit; a test substrate electrically connected to the inside of the test circuit; a substrate electrode formed on the test substrate; and a contact sheet formed on the test substrate to coat the substrate electrode; wherein the contact sheet is formed of the insulating porous layer; and the electrode or terminal of the electronic parts disposed at the time of testing is a solder bump or a solder ball.

According to another aspect of the invention, there is provided an apparatus for testing electronic parts, comprising a test circuit; a test substrate electrically connected to the inside of the test circuit; a substrate electrode formed on the test substrate; and the contact sheet for testing electronic parts as discussed herein; wherein the substrate electrode or the solder guiding material layer of the contact sheet for testing is melt-bonded to the electrode or terminal of the electronic parts disposed at the time of testing, and the electrode or terminal of the electronic parts is a solder bump or a solder ball.

According to another aspect of the invention, there is provided a method for testing electronic parts, comprising mounting electronic parts to be tested on the testing contact sheet of the apparatus for testing electronic parts as discussed herein, contacting the solder bump or solder ball as the electrode of the electronic parts to the connection electrode or the solder guiding material layer through the insulating porous layer and connecting by thermally melting; connecting the solder bump or solder ball of the electronic parts to the connection electrodes or the solder guiding material layer to electrically connect to the test circuit and testing the electronic parts by the test circuit; and separating the solder bump or solder ball from the testing contact sheet after completing the test.

According to another aspect of the invention, there is provided a method for testing electronic parts, comprising mounting electronic parts to be tested on the testing contact sheet of the apparatus for testing electronic parts as discussed herein, contacting the solder bump or solder ball as the electrode of the electronic parts to the substrate electrode or the solder guiding material layer and connecting by thermally melting; connecting the solder bump or solder ball of the electronic parts to the substrate electrode or the solder guiding material layer to electrically connect to the test circuit and testing the electronic parts by the test circuit; and separating the solder bump or solder ball from the testing contact sheet after completing the test.

According to another aspect of the invention, there is provided a method for manufacturing electronic parts, comprising mounting electronic parts to be tested on the testing contact sheet of the apparatus for testing electronic parts as discussed herein, contacting the solder bump or solder ball as the electrode of the electronic parts to the connection electrode or the solder guiding material layer through the insulating porous layer and connecting by thermally melting; connecting the solder bump or solder ball of the electronic parts to the connection electrode or the solder guiding material layer to electrically connect to the test circuit and testing the electronic parts by the test circuit; separating the solder bump or solder ball from the testing contact sheet after completing the test; among the testing contact sheet separated from the test substrate, impregnating the space between the testing contact sheet on which the electronic parts judged to be good by the test are mounted and the electronic parts and the insulating porous layer configuring the testing contact sheet with a resin; and attaching the solder ball used as the terminal to the connection electrode on the rear surface of the testing contact sheet.

According to another aspect of the invention, there is provided electronic parts having plural electrodes or terminals, wherein the electrodes or terminals of the electronic parts have substantially flat ends and substantially uniform height.

DETAILED DESCRIPTION OF THE INVENTION

Embodiments of the invention will be described with reference to the accompanying drawings. The embodiments will be described with reference to the drawings, but it is to be understood that the drawings are provided for illustration only and the invention is not limited to the drawings.

Figure 1A:
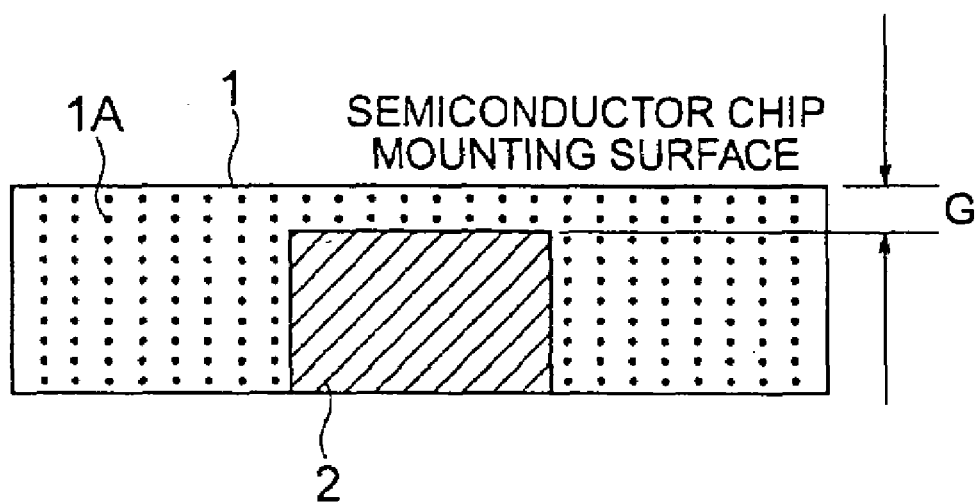
FIG. 1A and FIG. 1B are partially sectional diagrams of a contact sheet according to a first embodiment.
Figure 1B:
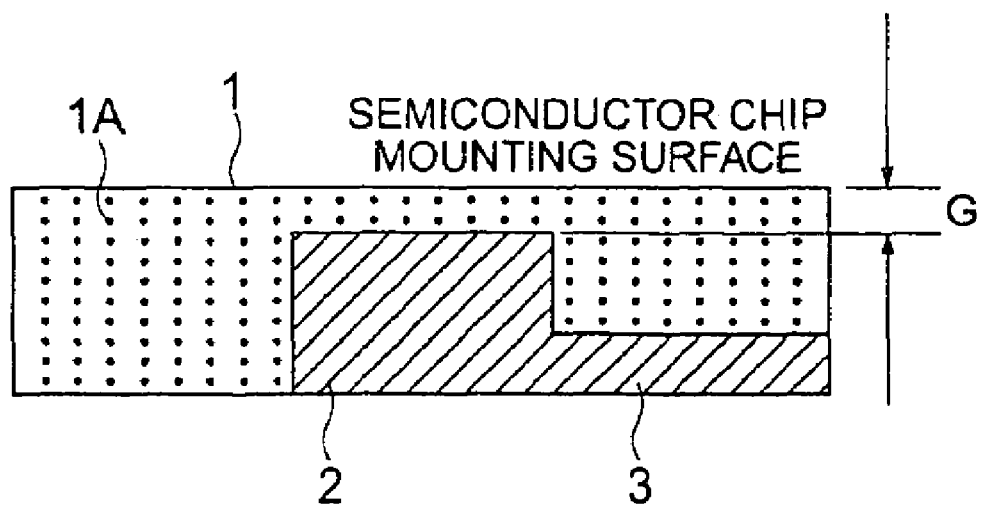
Figure 8:
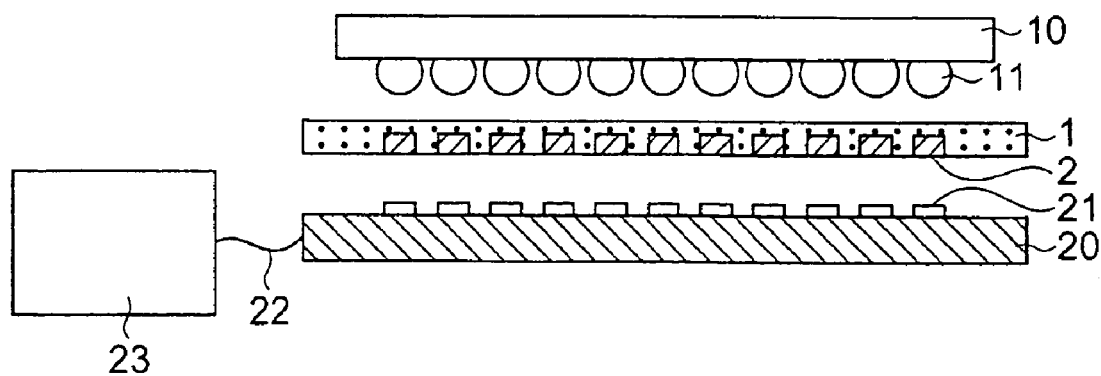
FIG. 8 is a schematic sectional diagram of a test apparatus illustrating a state of electrically connecting the electronic parts and a test circuit with a contact sheet therebetween according to the first embodiment.
Figure 9A:
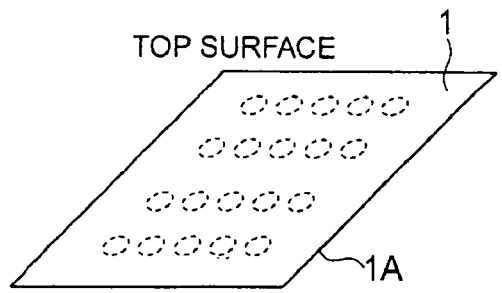
FIG. 9A to FIG. 9C are perspective diagrams of the contact sheet according to the first embodiment.
Figure 9B:
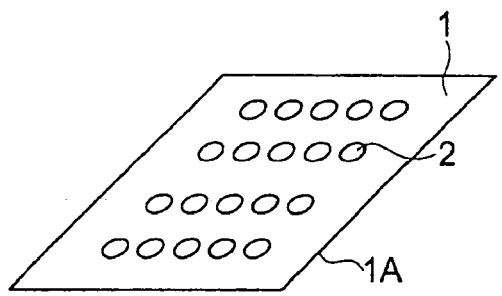
Figure 9C:
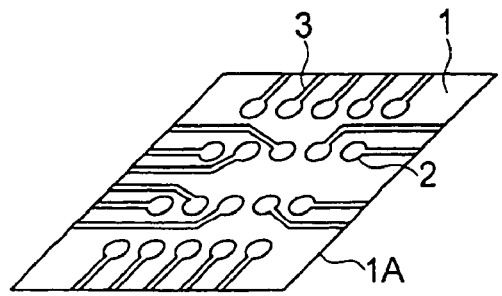
Figure 10:
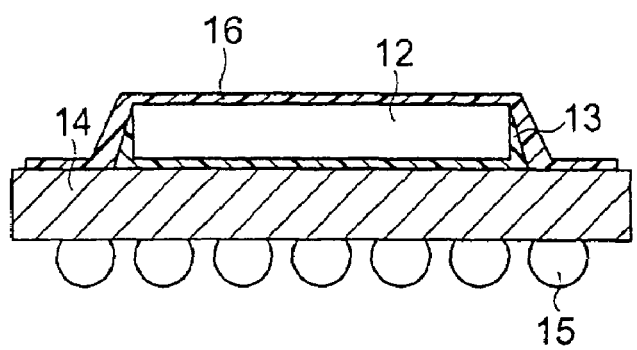
FIG. 10 is a sectional diagram of a BGA package as one example of the electronic parts according to the first embodiment.
Figure 11:
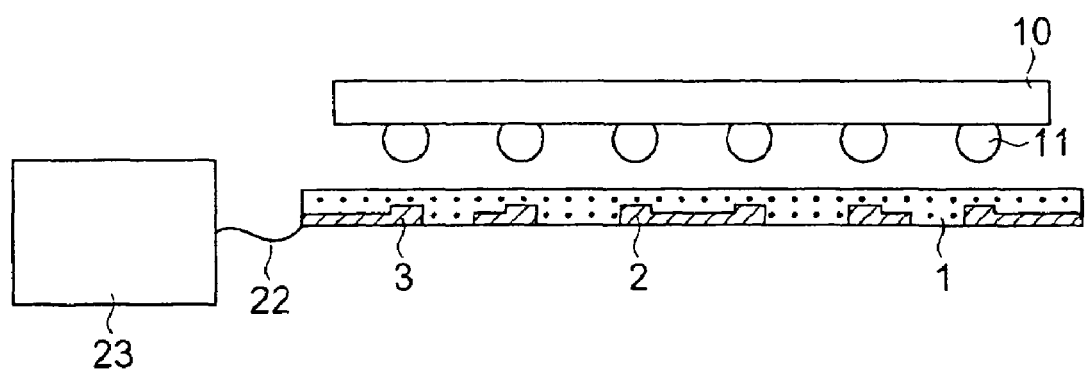
FIG. 11 is a schematic sectional diagram of a test apparatus illustrating a state of electrically connecting the electronic parts and the test circuit with the contact sheet therebetween according to the first embodiment.

First, a first embodiment will be described with reference to FIG. 1A to FIG. 3 and FIG. 8 to FIG. 11. FIG. 1A and FIG. 1B are partially sectional diagrams of a contact sheet (hereinafter referred to as the contact sheet) for testing electronic parts used in this embodiment, FIG. 2A to FIG. 2C are sectional diagrams of a step showing a coupling structure between the contact sheet and the electronic parts, FIG. 3 is a sectional diagram of the contact sheet and the electronic parts illustrating a state that the electronic parts are removed from the contact sheet, FIG. 8 is a schematic sectional diagram of a test apparatus illustrating a state that the electronic parts and the test circuit are electrically connected with the contact sheet therebetween, FIG. 9A to FIG. 9C are perspective diagrams of the contact sheet, FIG. 10 is a sectional diagram of a BGA package as an example of the electronic parts, and FIG. 11 is a schematic sectional diagram of another test apparatus illustrating a state that the electronic parts and the test circuit are electrically connected with the contact sheet therebetween.

As shown in FIG. 1A and FIG. 1B, a contact sheet 1 is comprised of an insulating porous layer (hereinafter referred to as the porous layer) 1A formed of an insulating material such as PTFE (polytetrafluoroethylene), polyimide, a liquid crystalline polymer including aramid or the like, connection electrodes 2 at least partly embedded in the porous layer 1A or the connection electrodes 2 and wiring 3 connected to the connection electrodes 2. The porous layer 1A has desirably a pore diameter of about 0.01 to 20 μm. If the porous layer 1A has a pore diameter of exceeding 20 μm, solder bumps 11 (to be described later), which are electrodes of the electronic parts, become hardly separable from the surface of the porous layer 1A, and if the porous layer 1A has a pore diameter of less than 0.01 μm, it becomes hard to penetrate a flux 4 (to be described later) which is needed for solder joint to the connection electrodes 2. As techniques for forming via and wiring within the porous layer as described above, there are Japanese Patent Laid-Open Application No. 2001-345537 and Japanese Patent Laid-Open Application No. 2001-83347. Pores of this porous layer are three-dimensionally continuous. The connection electrodes 2 are embedded beneath the top surface of the porous layer 1A, and a gap G between the top surface of the porous layer 1A and the top surface of the embedded connection electrodes 2 is 10 μm or below, and more preferably 0.01 to 5 μm. It is because if the gap G exceeds 10 μm, the solder becomes difficult to penetrate. The depth of the gap G is determined depending on the ease of penetration of the solder bumps which are used for the electrodes or terminals of the electronic parts as described later. The connection electrodes 2 or the connection electrodes 2 connected to the inside wiring 3 are arranged lengthwise and breadthwise at the center portion of the contact sheet 1. The top surface of the connection electrodes 2 is embedded in the porous layer 1A. The bottom surface of connection electrodes 2 and the bottom surface of the inside wiring 3 are exposed at the bottom surface of the porous layer 1A (see FIG. 9A to FIG. 9C).

To mount the electronic parts on the test apparatus, the connection electrodes 2 of the contact sheet 1 are arranged to face the electrodes or the terminals of the electronic parts such as a semiconductor chip, a semiconductor wafer, a BGA package or a passive element. Examples of the electrodes or the terminals of the electronic parts include solder balls and solder bumps. The contact sheet having the inside wiring is used for a test apparatus not using a test substrate.

Figure 2A:
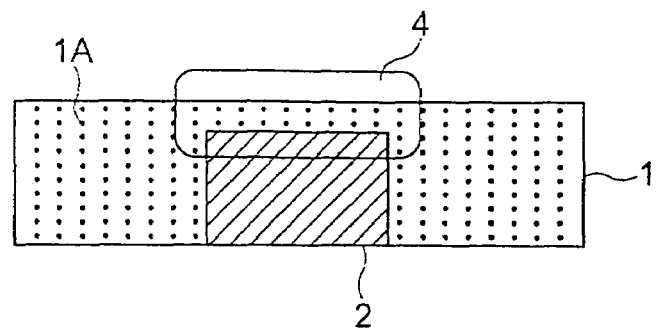
FIG. 2A to FIG. 2C are partially sectional diagrams of a step showing the coupling structure of the contact sheet and the electronic parts according to the first embodiment.
Figure 2B:
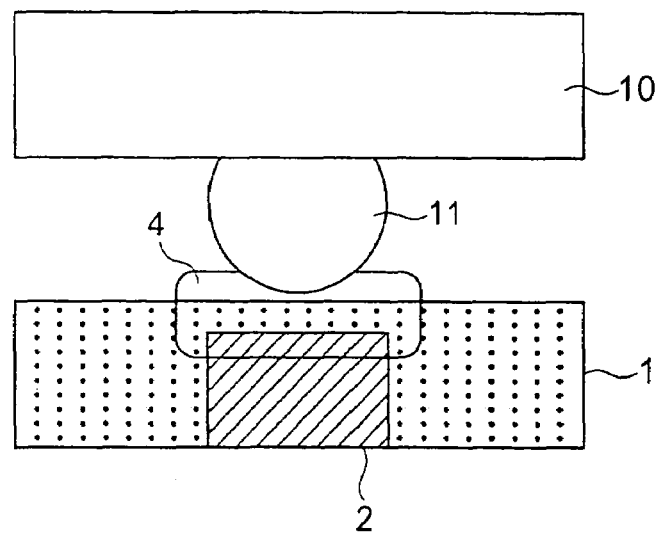
Figure 2C:
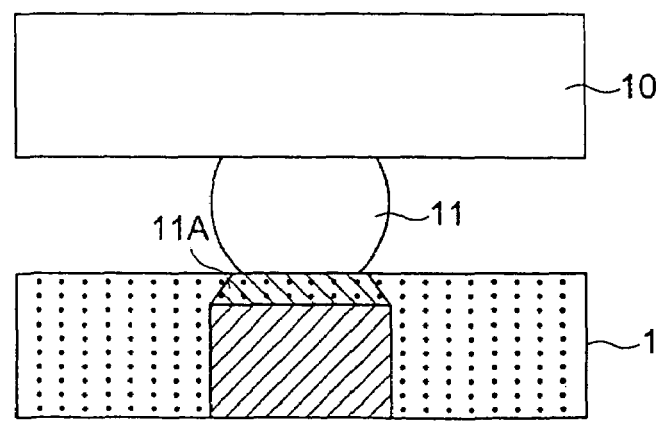
Figure 3:
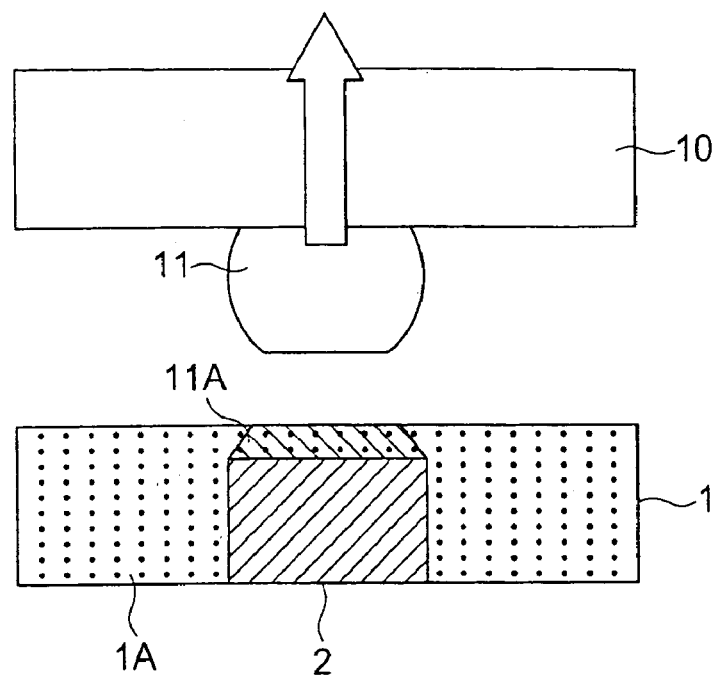
FIG. 3 is a partially sectional diagram of the contact sheet and the electronic parts illustrating a state that the electronic parts are removed from the contact sheet according to the first embodiment.

To operate the test apparatus, the electronic parts have their electrodes or terminals connected to the connection electrodes 2 of the contact sheet 1 as shown in FIG. 2A to FIG. 2C. In this embodiment, a semiconductor chip or wafer 10 is used for the electronic parts, and solder bumps 11 are used for the electrode or terminal. FIG. 2A to FIG. 2C show that the semiconductor chip or wafer 10 is connected to the contact sheet 1 by flip-chip bonding. First, the flux 4 or the like is applied to the chip-mounted surface of the contact sheet 1. The flux 4 penetrates into the porous layer 1A configuring the contact sheet 1 to reach the embedded connection electrodes 2 (FIG. 2A).

The flux becomes liquid at the time of solder melting, so that it is not necessarily required to be liquid at the time of applying. Then, the semiconductor chip or wafer 10 is mounted on it (FIG. 2B), the solder bumps 11 are approached to and melted on the surface of the porous layer 1A. Then, the solder partly penetrates into the porous layer 1A to connect the connection electrodes 2 and the solder bumps 11 by soldering. The solder bumps 11 flow into the porous layer 1A, so that it has its penetrated portion 11A in the porous layer (FIG. 2C). At this time, the level of a gap (G) (see FIG. 1A and FIG. 1B) from the surface of the connection electrodes 2 to the surface of the contact sheet 1 is determined to a prescribed value so to enable to accurately control a penetrating amount of the solder bumps 11 into the porous layer.

Then, an operation of testing the electronic parts after mounting the electronic parts on the test apparatus will be described with reference to FIG. 8. In this embodiment, a burn-in test and the like are performed. This connection structure and test method can also be applied to a BGA type semiconductor package (BGA package). The contact sheet 1 and the semiconductor chip or wafer 10 are arranged so that the connection electrodes 2 and the solder bumps 11 are mutually opposed and bonded by soldering as shown in FIG. 2C. The test apparatus is mainly comprised of a test circuit 23, a test substrate 20 and the contact sheet 1. For the test substrate 20, for example, a multilayer circuit board having a multilayer circuit laminated is used. When the wiring electrically connected to the connection electrodes is formed on the contact sheet (see FIG. 9C and FIG. 1B), the test substrate can be omitted because the wiring is connected to outside wiring which is directly connected to the test circuit. The test circuit 23 and the test substrate 20 are electrically connected by wiring 22 which is electrically connected to the multilayer circuit. Substrate electrodes 21 which are electrically connected to the multilayer circuit are formed on the main surface of the test substrate 20. The contact sheet 1 on which the semiconductor chip or wafer 10 is mounted is disposed on the test substrate 20 in such a way that the individual connection electrodes 2 are in contact with the individual substrate electrodes 21, and the test is performed.

After the test, the semiconductor chip or wafer 10 is removed, the solder bumps 11 are broken at the interface between the portion 11A penetrated into the porous layer and a portion not penetrated on the surface of the porous layer 1A as shown in FIG. 3, so that the semiconductor chip or wafer 10 is mechanically removed. The semiconductor chip or wafer 10 removed from the porous layer 1A has the solder bumps 11 having a shape that a height resulting from the subtraction of the height (10 μm or less) of the gap G from the diameter of the solder bumps 11 is substantially uniform. The semiconductor chip or wafer 10 having the solder bumps with the shape is obtained as a result of separation from the porous layer 1A. It can also be removed by immersing in a liquid and applying ultrasonic waves, and it is more effective as a step when the flux is washed at the same time. Besides, when the gap level from the surface of the contact sheet to the surface of the embedded connection electrodes is determined to a prescribed value as described above, a penetration amount of the solder bumps into the porous layer can be controlled accurately.

As described above, where the contact sheet having the electrodes in the porous layer and the semiconductor chip are connected by soldering, the semiconductor chip can be removed from the contact sheet while the electrode breakdown after the test or the expansion of unevenness of the bump's solder amount after peeling within the same semiconductor chip is prevented. Therefore, it is also possible to make a chip repair of mounting a good chip through the test on another package substrate or to reuse the test substrate.

The solder joint of the solder bumps of a semiconductor chip or the solder balls of a BGA package and the connection electrodes of the contact sheet reduces a mechanical load applied to the semiconductor chip or the package at the time of testing, and the test apparatus can be configured to have a simple structure with less mechanical operation parts.

The above-described BGA package used is, for example, the one as shown in FIG. 10. A semiconductor chip 12 such as silicon has solder bumps as an outside connection terminal (not shown). The substrate supporting the semiconductor chip is a wiring board 14 such as a multilayer circuit board, and solder balls (BGA balls) 15 are attached to the bottom surface. The connection electrodes (not shown) electrically connected to the solder balls through the inside multilayer circuit are formed on the top surface. The semiconductor chip 12 is mounted on the wiring board 14, the solder bumps of the semiconductor chip 12 are connected to the connection electrodes of the wiring board 14. Underfill resin 13 such as epoxy resin is sealed between the semiconductor chip 12 with the solder bumps and the wiring board 14, the semiconductor chip 12 on the wiring board 14 is sealed with a sealing resin 16 of epoxy resin or the like. Where the BGA package is tested by the test apparatus, the BGA package is mounted on the above-described contact sheet.

The test apparatus used in this embodiment has the structure shown in FIG. 8 and uses the test substrate. Specifically, the contact sheet is mounted on the test substrate, and the individual electrodes are directly contacted to electrically connect to the test circuit. Therefore, the contact sheet not requiring an inside wiring shown in FIG. 1A is used. On the other hand, the test apparatus not using a test substrate as shown in FIG. 11 is also known. This test apparatus is mainly comprised of the test circuit 23 and the contact sheet 1. The contact sheet 1 has the connection electrodes 2 and the inside wiring 3 electrically connected to the electrodes 2. This contact sheet is shown in FIG. 1B. The test circuit 23 and the contact sheet 1 are electrically connected by the wiring 22 which is electrically connected to the inside wiring 3 connected to the connection electrodes 2. And, the semiconductor chip or wafer 10 is mounted on the contact sheet 1, and the burn-in test or the like is performed.

Figure 5A:
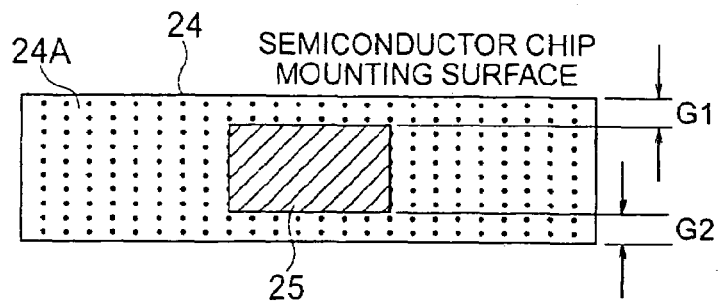
FIG. 5A and FIG. 5B are partially sectional diagrams of a contact sheet according to a second embodiment.
Figure 5B:
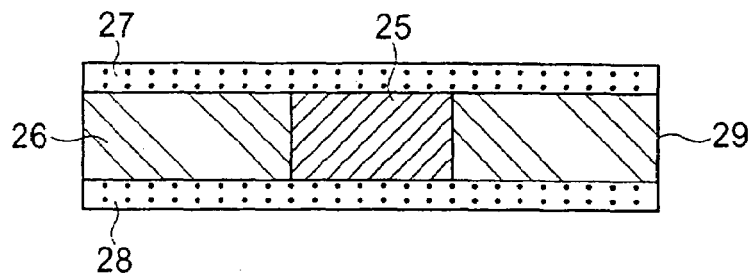

Then, the second embodiment will be described with reference to FIG. 5A and FIG. 5B. In this embodiment, a contact sheet which has the connection electrodes completely embedded into it will be described. FIG. 5A and FIG. 5B are partially sectional diagrams of the contact sheet. In FIG. 5A, a contact sheet 24 is comprised of a porous layer 24A formed of an insulating material such as PTFE, polyimide, a liquid crystalline polymer containing aramid or the like, and connection electrodes 25 embedded in the porous layer 24A. The porous layer 24A desirably has a pore diameter of about 0.01 to 20 µm. The pores of the porous layer are three-dimensionally continuous. The connection electrodes 25 are 10 µm or below, and more preferably 0.01 to 5 µm. Depths of these gaps G1, G2 between the top and bottom surfaces of the porous layer 24A and the surfaces of the embedded connection electrodes 25 are 10 µm or below, and more preferably 0.01 to 5 µm or less. Depths of these gaps G1, G2 are determined depending on the ease of penetration of the solder bumps used for the electrodes or terminals of the electronic parts such as semiconductor chips. The connection electrodes 25 are arranged lengthwise and breadthwise at the center portion of the contact sheet 24. The connection electrodes 25 are entirely embedded in the porous layer 24A. To mount the electronic parts on the test apparatus, the connection electrodes 25 of the contact sheet 24 are arranged to face the electrodes or terminals of the electronic parts such as a semiconductor chip or wafer or a BGA package.

FIG. 5B shows that a thin porous layer is adhered to an insulating via layer (called the via layer) in which conductive vias to be connection electrodes are formed. Specifically, a contact sheet 29 is configured of an insulating via layer 26 which has the connection electrodes (also called as the conductive via) 25 embedded, and thin porous layers 27, 28 which are formed on both sides of the via layer 26 to cover the connection electrodes 25 exposed at both sides of the via layer 26. The porous layers 27, 28 have thickness corresponding to the gaps G1, G2 shown in FIG. 5A. The material for the porous layers and the pore diameter of the porous layers are the same as those in FIG. 5A.

In FIG. 5A and FIG. 5B, the test apparatus used is the same one as shown in FIG. 8, the contact sheets 24 on which the semiconductor chip 10 is mounted are disposed on the test substrate so to have each connection electrode in contact with each substrate electrode, and the burn-in test or the like is performed.

After the test, the semiconductor chip is removed from the contact sheet. The solder bumps on the surface of the porous layer are broken at the interface between the penetrated portion in the porous layer and the non-penetrated portion as shown in FIG. 3, so that the semiconductor chip is mechanically removed. It is also possible to remove by immersing in a liquid and applying ultrasonic waves, and the step becomes more efficient when the flux is washed at the same time. Besides, when the gap level (the thickness of the porous layer in FIG. 5B) from the surface of the contact sheet to the surface of the embedded connection electrodes is determined to a prescribed value as described above, it becomes possible to control accurately the penetration amount of the solder bumps into the porous layer.

As described above, where the contact sheet having the electrodes in the porous layer and the semiconductor chip are connected by soldering, the semiconductor chip can be removed from the contact sheet while electrode breakdown after the test or the expansion of unevenness of the bump's solder amount after peeling within the same semiconductor chip is prevented. Therefore, it is also possible to make a chip repair of mounting a good chip through the test on another package substrate or to reuse the test substrate.

And, the solder joint of the solder bumps of the semiconductor chip and the connection electrodes of the contact sheet reduces a mechanical load applied to the semiconductor chip or the package at the time of testing, and the test apparatus can be configured to have a simple structure with less mechanical operation parts.

Figure 6A:
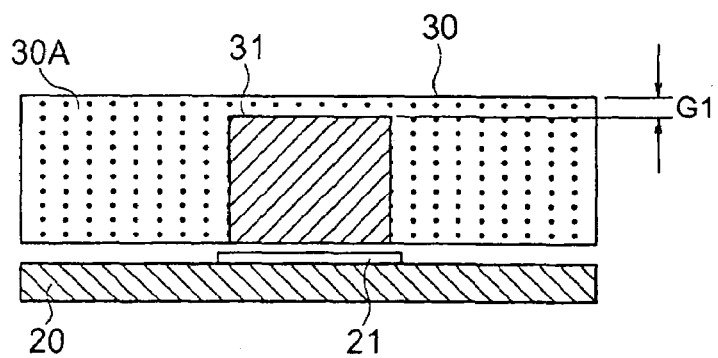
FIG. 6A and FIG. 6B are partially sectional diagrams showing a step of fixing a contact sheet to a test substrate according to a third embodiment.
Figure 6B:
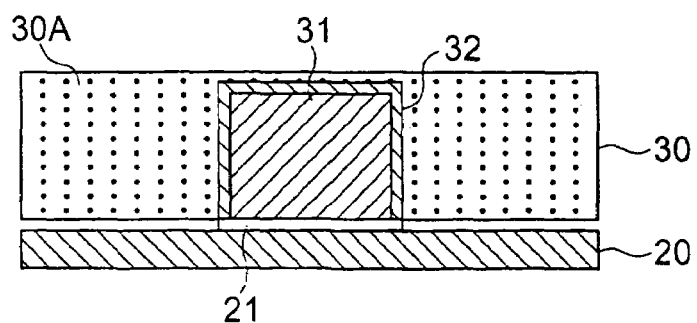

Then, the third embodiment will be described with reference to FIG. 6A and FIG. 6B. In this embodiment, a step of fixing the contact sheet to the test substrate by using a plated layer will be described. FIG. 6A and FIG. 6B are-sectional diagrams showing the step of fixing the contact sheet to the test substrate. As shown in FIG. 6A and FIG. 6B, a contact sheet 30 is comprised of a porous layer 30A formed of an insulating material such as PTFE, polyimide, a liquid crystalline polymer containing aramid or the like, and connection electrodes 31 which have one surface embedded into the porous layer 30A and the other surface exposed. The porous layer 30A desirably has a pore diameter of about 0.01 to 20 µm. The pores of the porous layer are three-dimensionally continuous. The connection electrodes 31 are embedded below the top surface of the porous layer 30A, and a gap G between the top surface (on which the semiconductor chip is mounted) of the porous layer 30A and the top surface of the embedded connection electrodes 31 is 10 µm or below, and more preferably 0.01 to 5 µm. The depth of the gap G is determined depending on the ease of penetration of the solder bumps which are used for the electrodes or terminals of the electronic parts. The connection electrodes 31 are arranged lengthwise and breadthwise at the center portion of the contact sheet 30. To mount the electronic parts on the test apparatus, the connection electrodes 31 of the contact sheet 30 are arranged to face the electrodes or terminals of the electronic parts such as a semiconductor chip.

Then, the surface where the connection electrodes 31 are exposed is faced to the test substrate 20 of the test apparatus, and the connection electrodes 31 are aligned with and mounted on the substrate electrodes 21 (FIG. 6A). Then, the surface of the connection electrodes 31 within the porous layer 30A is plated by electrolytic plating or the like to integrate the test substrate and the porous layer 30A. Then, the electronic parts such as a semiconductor chip are connected to the contact sheet by solder melting, and the test is performed.

When the semiconductor chip is removed from the contact sheet after the test is completed, the solder bumps are broken at the interface between the portion penetrated into the porous layer and the non-penetrated portion on the surface of the porous layer as shown in FIG. 3, so that the semiconductor chip is mechanically removed. It is also possible to remove by immersing in a liquid and applying ultrasonic waves, and the step becomes more efficient when the flux is washed at the same time. Besides, when the gap level from the surface of the contact sheet to the surface of the embedded connection electrodes is determined to a prescribed value, it becomes possible to control accurately the penetration amount of the solder bumps into the porous layer.

As described above, where the contact sheet having the electrodes in the porous layer and the semiconductor chip are connected by soldering, the semiconductor chip can be removed from the contact sheet after the test while the electrode breakdown or the expansion of unevenness of the bump's solder amount after peeling within the same semiconductor chip is prevented. Therefore, it is also possible to make a chip repair of mounting a good chip through the test on another package substrate or to reuse the test substrate.

And, the solder joint of the solder bumps of a semiconductor chip and the connection electrodes of a contact sheet reduces a mechanical load applied to the semiconductor chip or the package at the time of testing, and the test apparatus can be configured to have a simple structure with less mechanical operation parts.

Where the tested electronic parts is separated after the test, it is possible to separate only the electronic parts side because a joint strength becomes higher on the test substrate side than the solder-joined side by virtue of the plating process, so that.

Figure 7:
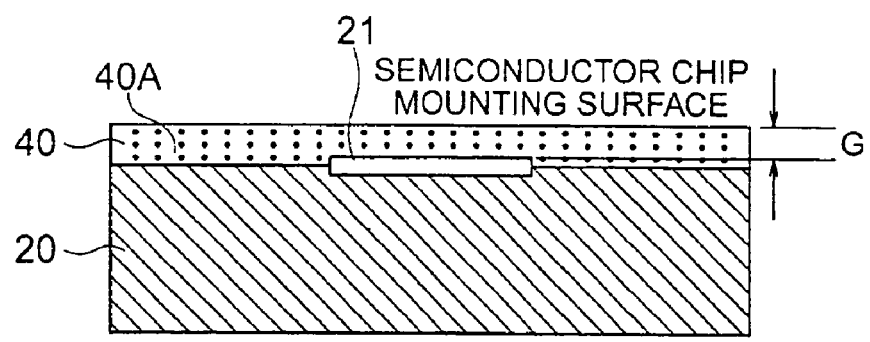
FIG. 7 is a sectional diagram of a contact sheet formed on a test substrate according to a fourth embodiment.

The fourth embodiment will be described with reference to FIG. 7. In this embodiment, the contact sheet formed in close contact with the test substrate will be described. FIG. 7 is a sectional diagram showing the contact sheet formed on the test substrate. For example, the test substrate 20 configuring the test apparatus shown in FIG. 8 has the substrate electrodes 21 formed on its surface. A thin porous layer 40A of 5 μm or less in thickness is adhered to cover the substrate electrodes 21. A contact sheet 40 used here is not provided with a connection electrode, so that the porous layer itself is the contact sheet. The solder bumps of the semiconductor chip or wafer are aligned with and mounted on the substrate electrodes 21 of the test substrate 20, and the solder on the semiconductor chip or wafer side is melted and connected to the substrate electrodes by ref low soldering.

Different from the other embodiments, the substrate electrodes of the test substrate play a role of the connection electrodes of the contact sheet, so that the semiconductor chip or wafer, the contact sheet and the test substrate are fixed at the same time.

The contact sheet 40 is comprised of the porous layer 40A formed of an insulating material such as PTFE, polyimide, a liquid crystalline polymer containing aramid or the like. The porous layer 40A desirably has a pore diameter of about 0.01 to 20 μm. The pores of the porous layer are three-dimensionally continuous. The substrate electrodes 21 are coated below the top surface of the porous layer 40A, and a gap G between the top surface of the porous layer 40A and the top surface of the substrate electrodes 21 is 10 μm or below, and more preferably 0.01 to 5 μm. The depth of the gaps G is determined depending on the ease of penetration of the solder bumps which are used for the electrodes or terminals of the electronic parts such as a semiconductor chip.

To mount the semiconductor chip or wafer on the test apparatus, the substrate electrodes 21 coated with the contact sheet 40 are arranged to face the electrodes or terminals of the electronic parts such as the semiconductor chip or wafer.

When the semiconductor chip is removed from the contact sheet after the test is completed, the solder bumps are broken at the interface between the portion penetrated into the porous layer and the non-penetrated portion on the surface of the porous layer, so that the semiconductor chip is mechanically removed. It is also possible to remove by immersing in a liquid and applying ultrasonic waves, and the step becomes more efficient when the flux is washed at the same time.

Besides, when the gap level from the surface of the contact sheet to the surface of the substrate electrodes is determined to a prescribed value, it becomes possible to control accurately the penetration amount of the solder bumps into the porous layer.

As described above, where the contact sheet and the semiconductor chip are bonded by soldering, the semiconductor chip can be removed from the contact sheet after the test while the electrode breakdown or the expansion of unevenness of the bump's solder amount after peeling within the same semiconductor chip is prevented. Therefore, it is also possible to make a chip repair of mounting a good chip through the test on another package substrate or to reuse the test substrate.

And, the solder joint of the solder bumps of a semiconductor chip and the connection electrodes of a contact sheet reduces a mechanical load applied to the semiconductor chip or the package at the time of testing, and the test apparatus can be configured to have a simple structure with less mechanical operation parts.

Then, the fifth embodiment will be described with reference to FIG. 4. As described above, where the contact sheet and the semiconductor chip are bonded by solder melting according to the present invention, the semiconductor chip or the like can be removed from the contact sheet after the test while the electrode breakdown or the expansion of unevenness of the bump's solder amount after peeling within the same semiconductor chip is prevented. Therefore, it is also possible to make a semiconductor chip repair of mounting a good chip through the test on another package substrate.

Figure 4:
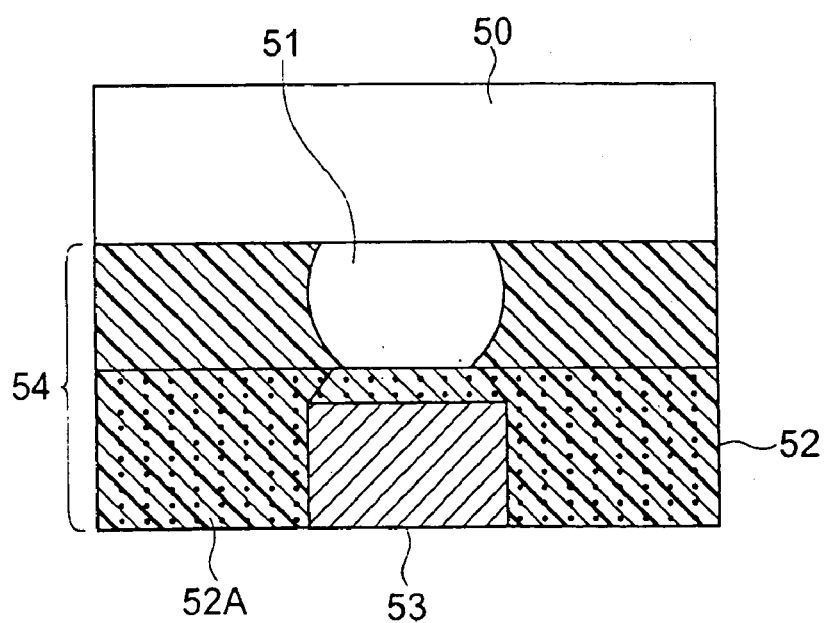
FIG. 4 is a partially sectional diagram of a packaged contact sheet mounted with a semiconductor wafer which is judged to be a good part as a result of the test according to a fifth embodiment.

FIG. 4 is a partial sectional diagram of a packaged contact sheet with the semiconductor wafer, which is judged to be a good part as a result of the test, mounted. For example, a semiconductor wafer such as silicon as the electronic parts is subjected to the burn-in test or the like according to the method of the first embodiment. And, for the contact sheet on which the semiconductor wafer having a good chip is mounted, the periphery of solder bumps 51 which are electrodes disposed on a semiconductor wafer 50 and a porous layer 52A configuring a contact sheet 52 are impregnated with a resin 54. Then, a semiconductor package is produced by performing an assembling step of attaching BGA balls to connection electrodes 53 and cutting the contact sheet 52.

According to this embodiment, the steps can be reduced by performing the test step and the connection step at the same time.

Figure 12:
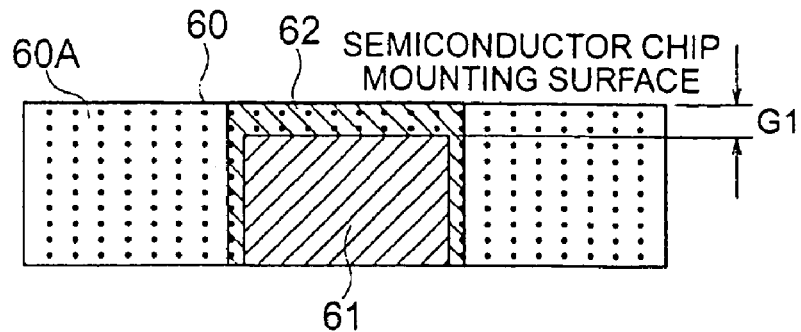
FIG. 12 is a partially sectional diagram of the contact sheet according to a sixth embodiment.
Figure 14A:
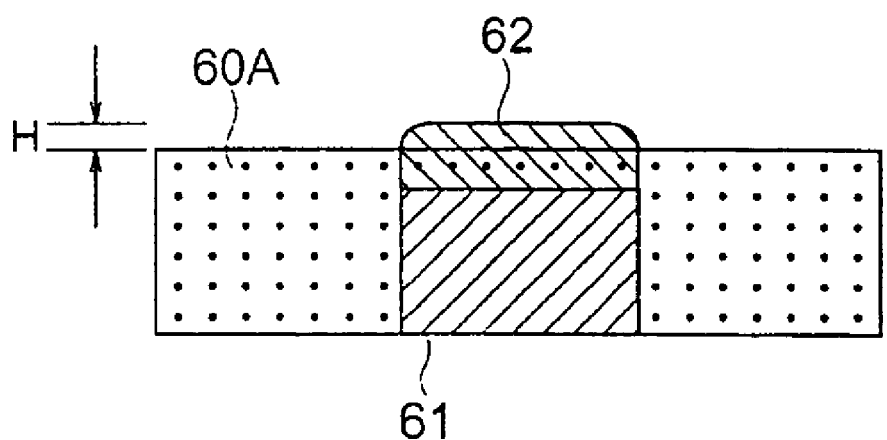
FIG. 14A and FIG. 14B are partially sectional diagrams of the contact sheet according to the sixth embodiment.
Figure 14B:
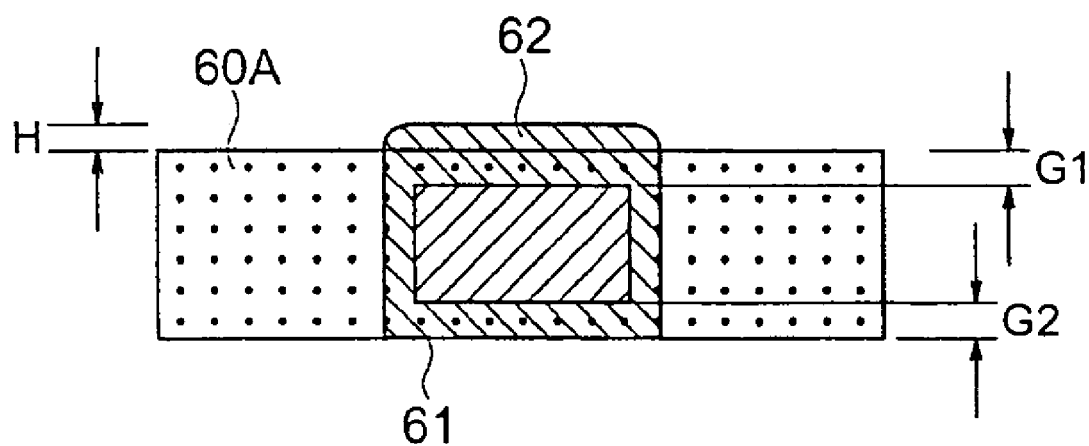
Figure 15A:
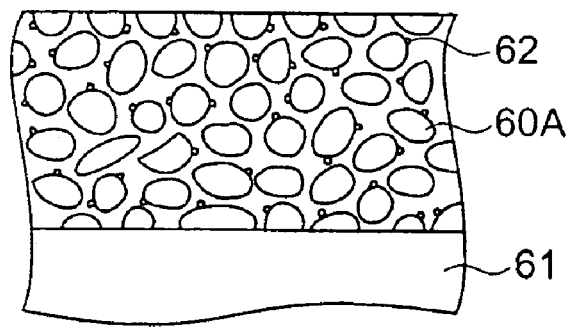
FIG. 15A to FIG. 15C are partially sectional diagrams partly enlarged of the contact sheet according to the sixth embodiment.
Figure 15B:
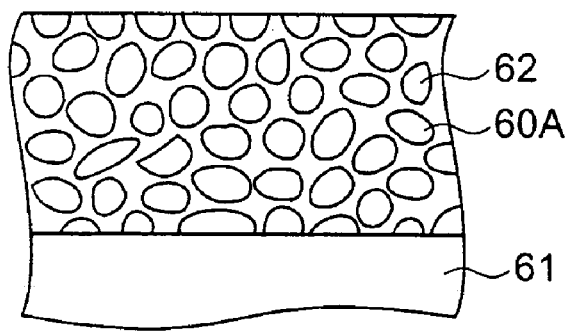
Figure 15C:
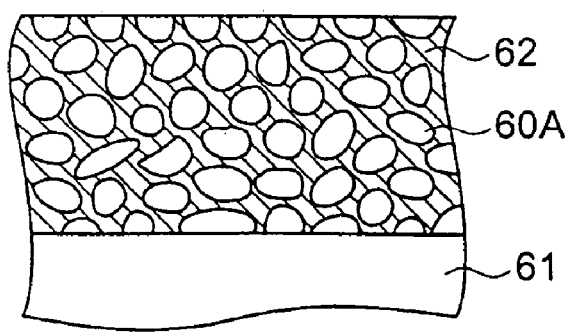
Figure 16A:
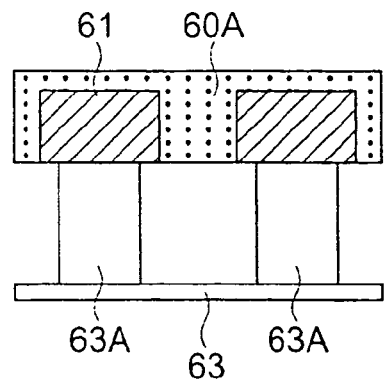
FIG. 16A and FIG. 16B are diagrams schematically showing a step of forming a solder guiding material layer according to the sixth embodiment.
Figure 16B:
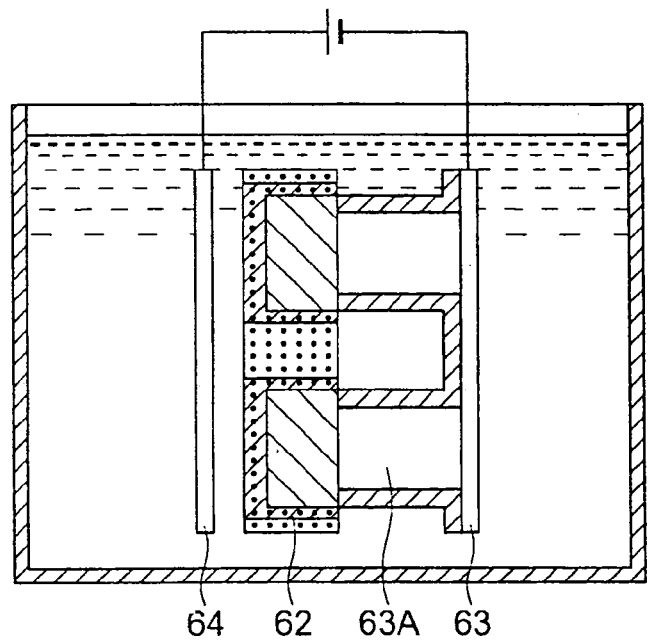

Then, the sixth embodiment will be described with reference to FIG. 12 to FIG. 16. In this embodiment, a contact sheet having a solder guiding material layer partly formed in the porous layer will be described. FIG. 12 to FIG. 14 are partially sectional diagrams of the contact sheet, FIG. 15A to FIG. 15C are partially sectional diagrams partly enlarged of the contact sheet, and FIG. 16A and FIG. 16B are diagrams schematically showing a step of forming the solder guiding material layer. As shown in FIG. 12, a contact sheet 60 is comprised of a porous layer 60A formed of an insulating material such as PTFE, polyimide, a liquid crystalline polymer containing aramid or the like, connection electrodes 61 embedded in the porous layer 60A, and a solder guiding material layer 62 partly formed in the porous layer 60A. The porous layer 60A desirably has a pore diameter of about 0.01 to 20 μm. The pores of the porous layer 60A are three-dimensionally continuous. The connection electrodes 61 are embedded below the top surface of the porous layer 60A, and the gap G between the top surface of the porous layer 60A and the surface of the embedded connection electrodes 61 is 5 μm or more, and more preferably 10 μm or more. The gap G is desirablye 400 μm or below in view of the allowable range of an electric resistance value when, for example, Sn is used for the solder guiding material layer 62 and the connection electrodes 61 having a diameter of 100 μm are produced. The portion of the porous layer 60A other than the portion where the solder guiding material layer 62 is formed may be impregnated with a resin. The connection electrodes 61 are arranged lengthwise and breadthwise at the center portion of the contact sheet 60. The top surface of the connection electrodes 61 is embedded in the porous layer 60A, and the bottom surface of the connection electrodes 61 is exposed from the bottom surface of the porous layer 60A.

Figure 13A:
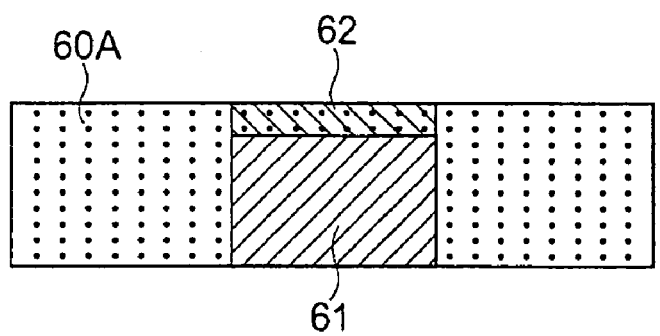
FIG. 13A and FIG. 13B are partially sectional diagrams of the contact sheet according to the sixth embodiment.
Figure 13B:
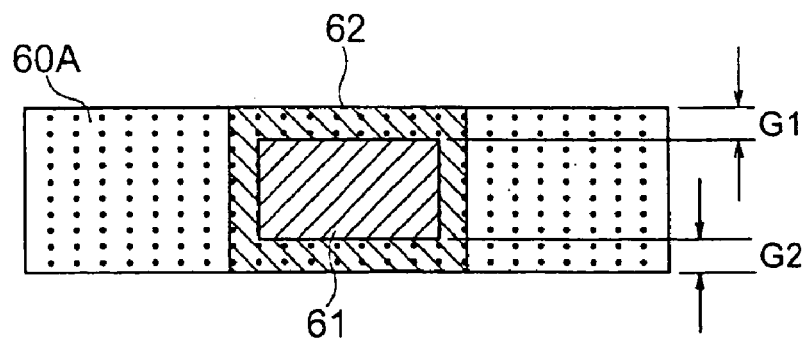

The solder guiding material layer 62 is formed in a part of the porous layer 60A between the top surface of the porous layer 60A and the top surface of the connection electrodes 61 and a part of the porous layer 60A near the side face of the connection electrodes 61. It is adequate when the solder guiding material layer 62 is formed in a part of the porous layer 60A between at least the top surface of the porous layer 60A and the top surface of the connection electrodes 61. In addition to the one shown in FIG. 12, the solder guiding material layer 62 may be formed in only a part of the porous layer 60A between the top surface of the porous layer 60A and the top surface of the connection electrodes 61 as shown in FIG. 13A, or the solder guiding material layer 62 may be formed in a part of the porous layer 60A between the top surface of the porous layer 60A and the top surface of the connection electrodes 61 and a part of the porous layer 60A between the bottom surface of the porous layer 60A and the bottom surface of the connection electrodes 61 and a part of the porous layer 60A near the side surfaces of the connection electrodes 61 as shown in FIG. 13B. As shown in FIG. 14A and FIG. 14B, the solder guiding material layer 62 may be formed to bulge on the porous layer 60A. Here, gaps G1, G2 between the top and bottom surfaces of the porous layer 60A and the surfaces of the embedded connection electrode 61 are 5 μm or more, and more preferably 10 μm or more in FIG. 13B and FIG. 14B. In FIG. 13A and FIG. 14A, height H of the solder guiding material layer 62 from the top surface of the porous layer 60A is preferably about 20 μm or below. If the height H exceeds 20 μm and the solder guiding material layer 62 is configured of Sn or an alloy containing Sn having a composition closer to that of the solder bumps 11, the Sn or the alloy containing Sn is inadmissibly diffused into the solder bumps 11, and the composition of the solder bumps 11 is changed.

And, the forming of the solder guiding material layer 62 includes a case that the substance configuring the solder guiding material layer 62 is, for example, dispersed into a portion of the porous layer 60A between the top surface of the porous layer 60A and the top surface of the connection electrodes 61 as shown in FIG. 15A, a case that the surface of the porous body of the portion is coated as shown in FIG. 15B, and a case that the substance configuring the solder guiding material layer 62 is laid in the portion as shown in FIG. 15C.

The solder guiding material layer 62 can be configured of Sn, an alloy containing Sn such as Sn-Pb or Sn-Ag, another metal having a melting point of 300° C. or below. Here, the metal is limited to the melting point of 300° C. or below in view of the heat resistance of the electronic parts to be inspected and the testing substrate. In FIG. 15A and FIG. 15B, the solder guiding material layer 62 may be formed of any resin having good wettability to the solder bumps 11 other than the above-described substances. Here, it does not require that whole of the gaps are composed of the solder guiding material layer 62 according to one aspect shown in FIG. 15A to FIG. 15C. For example, two-layer structure formed of the layer shown in FIG. 15C and the layer shown in FIG. 15A, and a multiple layer formed of the individual layers may be employed.

For example, the solder guiding material layer 62 may be formed as follows. First, a cathode electrode 63 is attached to a surface of the porous layer 60A on the bottom side which the connection electrodes 61 are embedded as shown in FIG. 16A. Columnar portions 63A which are higher than the thickness of the porous layer 60A are formed on the cathode electrode 63, and the columnar portions 63A are attached to the porous layer 60A so as to come into contact with the portions where the connection electrodes 61 are embedded. Here, the height of the columnar portions 63A is determined to be higher than the thickness of the porous layer 60A in order to prevent plating from being embedded into the portion of the porous layer 60A located above the portion of the cathode electrode 63 other than the columnar portions 63A. And, an anode electrode 64 is disposed to face the cathode electrode 63 with the porous layer 60A between them. And, they are immersed in an electrolytic plating solution such as an electrolytic Sn plating solution as shown in FIG. 16B, and a voltage is applied between the anode electrode 64 and the cathode electrode 63 to apply electrolytic plating. Thus, the entrance of plating into the porous layer 60A plates the peripheries of the connection electrodes 61 to form the solder guiding material layer 62 as shown in FIG. 12. The solder guiding material layer 62 can also be formed by the electroless plating. In this case, the solder guiding material layer 62 can be formed by dipping, for example, the connection electrodes 61 embedded in the porous layer 60A in an electroless plating solution.

Then, an operation of testing the electronic parts which is mounted on the test apparatus will be described. For example, the test apparatus shown in FIG. 8 is used, the contact sheet 60 on which the semiconductor chip or wafer 10 is mounted is placed on the test substrate 20 so that each connection electrode 61 comes into contact with each substrate electrode 21, and the burn-in test and the like are conducted. Here, where the semiconductor chip or wafer 10 is mounted on the contact sheet 60, the contact sheet 60 and the semiconductor chip or wafer 10 are arranged so as to face the connection electrodes 61 and the solder bumps 11, and the connection electrodes 61 or the solder guiding material layer 62 and the solder bumps 11 are bonded by soldering. Specifically, for example, where the substance configuring the solder guiding material layer 62 is dispersed into the portion of the porous layer 60A between the top surface of the porous layer 60A and the top surface of the connection electrodes 61 as shown in FIG. 15A and where the surface of the porous body of the pertinent portion is coated with the substance configuring the solder guiding material layer 62 as shown in FIG. 15B, the solder bumps 11 are melt-bonded to the connection electrodes 61, and where the substance configuring the solder guiding material layer 62 is laid in the portion of the porous layer 60A between the top surface of the porous layer 60A and the top surface of the connection electrodes 61 as shown in FIG. 15C, the solder bumps 11 are melt-bonded to the solder guiding material layer 62.

This embodiment provides the following effects in addition to the effects described in the first embodiment. Where the substance configuring the solder guiding material layer 62 is dispersed in the portion of the porous layer 60A between the top surface of the porous layer 60A and the top surface of the connection electrodes 61 and where the surface of the porous body of the pertinent portion is coated with the substance configuring the solder guiding material layer 62, the wettability of the solder bumps 11 in the porous layer 60A can be improved, so that the solder bumps 11 become easy to penetrate into the porous layer 60A. Thus, even when the gaps G, G1, G2 are 5 µm or more, the solder bumps 11 can be connected to the connection electrodes 61. Because the gaps G, G1, G2 are 5 µm or more, the substance configuring the connection electrodes 61 becomes hard to disperse into the portion of the solder bumps 11 on the porous layer 60A, so that a composition change of the solder bumps 11 on the side of the semiconductor chip or wafer 10 after separating from the contact sheet 60 can be suppressed.

Where the substance configuring the solder guiding material layer 62 is Sn or an alloy containing Sn and is laid in the portion of the porous layer 60A between the top surface of the porous layer 60A and the top surface of the connection electrodes 61, the solder bumps 11 are electrically connected to the connection electrodes 61 through the solder guiding material layer 62, the substance configuring the connection electrodes 61 becomes hard to disperse into the solder bumps 11, and a composition change of the solder bumps 11 can be suppressed. Here, the Sn or the alloy containing Sn configuring the solder guiding material layer 62 might disperse into the solder bumps 11, but the Sn or the alloy containing Sn has a composition similar to that of the solder bumps 11, so that even if the Sn or the alloy containing Sn is dispersed into the solder bumps 11, a composition change of the solder bumps 11 is small to a permissible level.

By forming the solder guiding material layer 62, the flatness of the solder bumps 11 on the side of the semiconductor chip or wafer 10 after the solder bumps 11 are separated from the contact sheet 60 can be improved, so that a volume change of the solder bumps 11 can be reduced.

Figure 17:
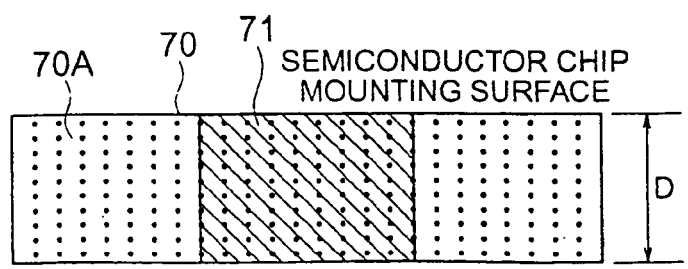
FIG. 17 is a partially sectional diagram of a contact sheet according to a seventh embodiment.
Figure 18:
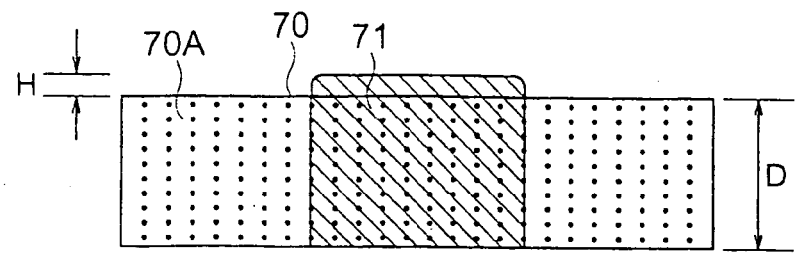
FIG. 18 is a partially sectional diagram of the contact sheet according to the seventh embodiment.
Figure 19A:
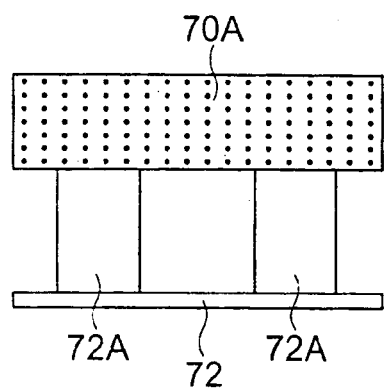
FIG. 19A and FIG. 19B are diagrams schematically showing a step of forming a solder guiding material layer according to the seventh embodiment.
Figure 19B:
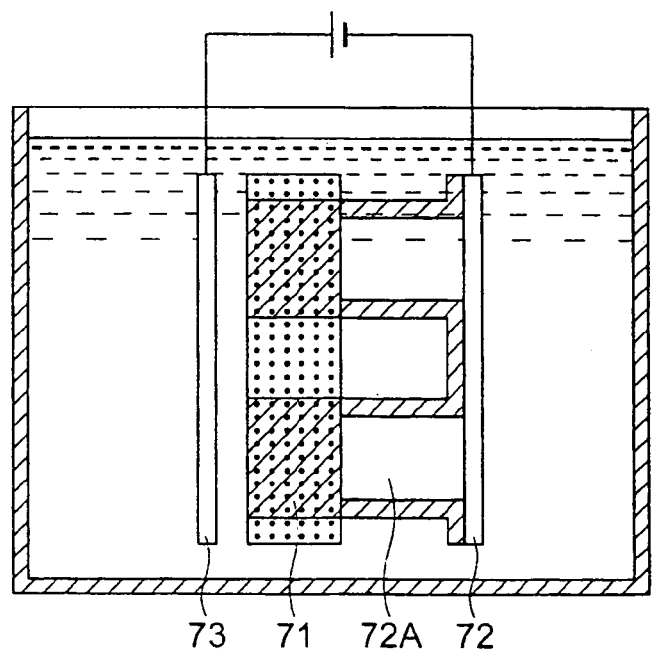

Then, the seventh embodiment will be described with reference to FIG. 17 to FIG. 19. In this embodiment, a contact sheet which is not provided with a connection electrode and has a solder guiding material layer partly formed in a porous layer will be described. FIG. 17 and FIG. 18 are partial sectional diagrams of the contact sheet, and FIG. 19A and FIG. 19B are schematic diagrams showing a step of forming the solder guiding material layer. As shown in FIG. 17, a contact sheet 70 is comprised of, for example, a porous layer 70A formed of an insulating material of such as PTFE, polyimide, a liquid crystalline polymer containing aramid or the like, and a solder guiding material layer 71 partly formed in the porous layer 70A. The porous layer 70A desirably has a pore diameter of about 0.01 to 20 µm. The pores of the porous layer 70A are three-dimensionally continuous. The porous layer 70A desirably has a thickness D of 400 µm or less in view of the allowable range of an electric resistance value when, for example, Sn is used as the solder guiding material layer 71 and the solder guiding material layer 71 having a diameter of 100 µm is produced. An, the portion of the porous layer 70A other than the portion where the solder guiding material layer 71 is formed may be impregnated with a resin.

The solder guiding material layer 71 is partly formed in the porous layer 70A and from the top to bottom surfaces of the porous layer 70A. It is advisable that the solder guiding material layer 71 is at least partly formed in the porous layer 70A, and the solder guiding material layer 71 may be formed to bulge on the porous layer 70A as shown in FIG. 18. In FIG. 18, the solder guiding material layer 71 desirably has height H of about 20 µm or below from the top surface of the porous layer 70A. It is not desirable if the height H exceeds 20 µm, because even if the solder guiding material layer 71 is formed of Sn or an alloy containing Sn similar to the composition of the solder bumps 11, the Sn or an alloy containing Sn is inadmissibly dispersed into the solder bumps 11 to change the composition of the solder bumps 11. The forming of the solder guiding material layer 71 has the same meaning as in the sixth embodiment.

The solder guiding material layer 71 can be configured of Sn, an alloy containing Sn such as Sn-Pb or Sn-Ag, another metal having a melting point of 300° C. or below. Here, the metal is limited to the melting point of 300° C. or below in view of the heat resistance of the electronic parts to be inspected and the testing substrate. When the substance configuring the solder guiding material layer 71 is dispersed into the porous layer 70A and coats the surface of the porous body, the solder guiding material layer 71 may be configured of a resin having good wettability to the solder bumps 11 other than those described above. Besides, it does not require that whole of the gaps are composed of the solder guiding material layer 71 according to one aspect. For example, it may be configured to have a multiple layer structure formed of a layer dispersed into the porous layer 70A and a filled layer.

For example, the solder guiding material layer 71 may be formed as follows. First, a cathode electrode 72 is attached to the top or bottom surface of the porous layer 70A as shown in FIG. 19A. Columnar portions 72A which are higher than the thickness of the porous layer 70A are formed on the cathode electrode 72, and the porous layer 70A is attached to the columnar portions 72A. Here, the height of the columnar portions 72A is determined to be higher than the thickness of the porous layer 70A in order to prevent plating from being embedded into the portion of the porous layer 70A located above the portion of the cathode electrode 72 other than the columnar portions 72A. And, an anode electrode 73 is disposed to face the cathode electrode 72 with the porous layer 70A between them. And, they are immersed in an electrolytic plating solution such as an electrolytic Sn plating solution as shown in FIG. 19B, and a voltage is applied between the anode electrode 73 and the cathode electrode 72 to apply electrolytic plating. Thus, plating enters into the porous layer 70A to form the solder guiding material layer 71 shown in FIG. 17. The solder guiding material layer 71 can also be formed by the electroless plating.

Then, an operation of testing the electronic parts which is mounted on the test apparatus will be described. For example, the test apparatus shown in FIG. 8 is used, the contact sheet 70 is placed on the test substrate 20 so that the solder guiding material layer 71 is positioned on the substrate electrodes 21, the individual substrate electrodes 21 and the solder bumps 11 are arranged to face one another, the substrate electrodes 21 or the solder guiding material layer 71 and the solder bumps 11 are bonded by soldering, and the burn-in test and the like are conducted. Here, where the substrate electrodes 21 or the solder guiding material layer 71 and the solder bumps 11 are bonded by soldering, if the substance configuring the solder guiding material layer 71 is dispersed into the porous layer 70A and coats the surface of the porous body, the solder bumps 11 are melt-bonded to the substrate electrodes 21, and if the substance configuring the solder guiding material layer 71 is laid in the porous layer 70A, the solder bumps 11 are melt-bonded to the solder guiding material layer 62.

This embodiment has the following effects in addition to the effects described in the fourth embodiment. Where the substance configuring the solder guiding material layer 71 is dispersed into the porous layer 70A and coats the surface of the porous body, the wettability of the solder bumps 11 in the porous layer 70A can be improved, so that the solder bumps 11 become easy to penetrate into the porous layer 70A. Thus, even if the thickness D is 5 μm or more, the solder bumps 11 can be connected to the substrate electrodes 21. Because, the thickness D is 5 μm or more, the substance configuring the substrate electrodes 21 becomes hard to disperse into the portion of the solder bumps 11 on the porous layer 70A, so that a composition change of the solder bumps 11 on the side of the semiconductor chip or wafer 10 after the separation from the contact sheet 70 can be suppressed.

Where the substance configuring the solder guiding material layer 71 is Sn or an alloy containing Sn and at least partly is laid in the porous layer 70A, the solder bumps 11 are electrically connected to the substrate electrodes 21 through the solder guiding material layer 71, so that the substance configuring the substrate electrodes 21 becomes hard to disperse into the solder bumps 11, and a composition change of the solder bumps 11 can be suppressed. Here, the Sn or the alloy containing Sn configuring the solder guiding material layer 71 might disperse into the solder bumps 11, but the Sn or the alloy containing Sn has a composition similar to that of the solder bumps 11. Therefore, even if the Sn or the alloy containing Sn is dispersed into the solder bumps 11, a composition change of the solder bumps 11 is small to an admissible level.

By forming the solder guiding material layer 71, flatness of the solder bumps 11 on the side of the semiconductor chip or wafer 10 after separating the solder bumps 11 from the contact sheet 71 can be improved, so that a volume change of the solder bumps 11 can be reduced.

Then, the porous body used in the present invention will be described. For the porous body, specifically, a porous sheet having three-dimensional continuous pores formed in a sheet of a polymer material or the like, cloth or unwoven cloth having polymer fibers or ceramics fibers entangled into a three-dimensional net shape, or the like is used. More specifically, the porous body may be, for example, a drawn sheet of a crystalline polymer of polypropylene, polytetrafluoroethylene or the like, or polyimide formed by using a phase separation phenomenon such as spinodal decomposition or microphase separation of a polymer. And, the cloth or the unwoven cloth used is formed of ceramic fibers or polymer fibers.

As the ceramic fibers, for example, silica glass fibers, alumina fibers, silicon carbide fibers, potassium titanate fibers or the like are used. As the polymer fibers, for example, liquid crystalline polymer or high Tg polymer fibers such as aromatic polyamide fibers or aromatic polyester fibers, fluorine-based polymer fibers such as PTFE fibers, polyparaphenylene sulfide fibers, aromatic polyimide fibers, polybenzoxazole derivative fibers, or the like are used. The ceramic fibers and the polymer fibers may be mixed, and composite fibers of ceramics and polymer may also be used.

The unwoven cloth is more desirable than the cloth because fibers are three-dimensionally entangled and a pore diameter is uniform. Besides, as the unwoven cloth, for example, an unwoven cloth of polymer fibers produced by a melt-blow method, an unwoven cloth made of fine fibers which are obtained by finely crushing fibers of liquid crystalline polymer such as aromatic polyamide and have a diameter of about 0.1 to 0.3 μm, or the like is desirable because a fiber diameter is very small and a pore diameter is uniform. Such an unwoven cloth is desirably treated to improve dimensional stability by preventing the fibers from displacing by mutually adhering the fibers, coating the polymer or the like.

Among the above-described porous bodies, the porous body having polytetrafluoroethylene drawn, the porous body of polyimide or the like formed by using the phase separation phenomenon, and the unwoven cloth of fine fibers of liquid crystalline polymer are desirable because they have a porous structure, which is three-dimensionally homogeneous and of less anisotropy, and a uniform pore diameter.

What is claimed is:

1. A contact sheet which is disposed between a terminal of an electronic part and a terminal of a test device of the electronic part, comprising:
   a connection electrode for connecting the terminal of the electronic part and the terminal of the test device electrically;
   an insulating porous layer configured such that when a solder is applied, it partially penetrates into the insulating porous layer, thereby electrically connecting the connection electrode and the terminal of the electronic part, and which is disposed between the connection electrode and the terminal of the electronic part;
   wherein a thickness of the insulating porous layer facing the terminal of the electronic part is 10 μm or below; and
   wherein the insulating porous layer is penetrated by a solder guiding material so as to form a solder guiding area in the insulating porous layer guiding the solder to the connection electrode.

2. The contact sheet as set forth in claim 1,
   wherein the insulating porous layer is further disposed between the connection electrode and the terminal of the test device so that the solder further electrically connects the connection electrode and the terminal of the test device.

3. The contact sheet as set forth in claim 1,
   wherein the solder guiding material is comprised of Sn or an alloy containing the Sn.

4. The contact sheet as set forth in claim 1,
   wherein a thickness of the solder guiding area facing the connection electrode is 5 □m or more.

5. The contact sheet as set forth in claim 1,
   wherein the connection electrode is formed by a solder guiding material which is comprised of Sn or an alloy containing the Sn, at least partly formed in the insulating porous layer.

6. A test device of an electronic part, comprising:
   a test substrate for mounting the electronic part, the test substrate having a terminal of the test device thereon; and
   the contact sheet as set forth in claim 5 which covers a surface of the test substrate, wherein:
   the terminal of the electronic part is a solder bump or a solder ball; and the connection electrode is melt-bonded with the terminal of the electronic part.

7. The test device as set forth in claim 6, further comprising:
a test circuit for testing the electronic part, the test circuit is connected with the terminal of the test device on the test substrate.

8. A method for testing an electronic part, comprising:
mounting the electronic part to be tested on the contact sheet of the test device as set forth in claim 6;
connecting the solder bump or solder ball of the electronic part to the terminal on the test substrate or the solder guiding material by thermally melting so as to electrically connect the electronic part and the test circuit;
testing the electronic part by the test circuit; and
separating the solder bump or solder ball of the electronic part from the contact sheet after completing the test.

9. A test device of an electronic part, comprising:
a test substrate for mounting the electronic part, the test substrate having a terminal of the test device thereon; and
the contact sheet as set forth in claim 1 in which the terminal of the test device on the test substrate is connected with the contact electrode, wherein:
the terminal of the electronic part is a solder bump or a solder ball; and
the connection electrode is melt-bonded with the terminal of the electronic part.

10. The test device as set forth in claim 9, further comprising:
a test circuit for testing the electronic part, the test circuit being connected with the terminal of the test device on the test substrate.

11. A method for testing an electronic part, comprising:
mounting the electronic part to be tested on the contact sheet of the test device as set forth in claim 10;
connecting the solder bump or solder ball of the electronic part to the connection electrode through the insulating porous layer by thermally melting so as to electrically connect the electronic part and the test circuit;
testing the electronic part by the test circuit; and
separating the solder bump or solder ball of the electronic part from the contact sheet after completing the test.

12. The method for testing an electronic part as set forth in claim 11,
wherein the solder bump or solder ball is separated by breaking at an interface between a portion containing the insulating porous layer and a portion not containing it.

13. The method for testing an electrode part as set forth in claim 11,
wherein the step of connecting includes impregnating an interface between the insulating porous layer and the connection electrode and its neighborhood with a flux before the solder bump or solder ball is contacted to the connection electrode.

14. A method for manufacturing electronic parts, comprising:
mounting the electronic part to be tested on the contact sheet of the test device as set forth in claim 10;
connecting the solder bump or solder ball to the connection electrode through the insulating porous layer by thermally melting so as to electrically connect the electronic part and the test circuit;
testing the electronic parts by the test circuit;
separating the solder bump or solder ball of the electronic part from the contact sheet after completing the test;
among the testing contact sheet separated from the test substrate, impregnating a space between a contact sheet on which an electronic part judged to be good by the test are mounted and the electronic part and an insulating porous layer configuring the contact sheet with a resin; and
attaching the solder ball used as a terminal to the connection electrode on a rear surface of the contact sheet.

15. A test device of an electronic part, comprising:
a test substrate for mounting the electronic part, the test substrate having a terminal of the test device thereon;
a test circuit for testing the electronic part, the test circuit is connected with the terminal of the test device on the test substrate; and
the contact sheet as set forth in claim 1 which covers a surface of the test substrate,
wherein the connection electrode of the contact sheet is disposed between the test substrate and the insulating porous layer as a substrate electrode.

* * * * *